United States Patent [19]

Corfits et al.

[11] Patent Number: 4,853,830
[45] Date of Patent: Aug. 1, 1989

[54] THREE STAGE SELF ALIGNMENT STRUCTURE AND METHOD

[75] Inventors: William D. Corfits; John T. Gullicksrud, both of Rochester; Bradley L. Martin, Byron; Robert W. McCutcheon, Pine Island; Jerry R. Rasmussen, Rochester; Gordon W. Westphal, Rochester; Stephen E. Wheeler, Rochester, all of Minn.

[73] Assignee: International Business Machines Corporation, Armonk, N.Y.

[21] Appl. No.: 169,638

[22] Filed: Mar. 17, 1988

[51] Int. Cl.[4] .............................................. H02B 1/20
[52] U.S. Cl. .................................... 361/391; 361/415; 439/296; 439/372; 439/378
[58] Field of Search .......... 211/41; 361/335, 337-339, 361/386, 388, 390, 391, 393, 394, 395, 413, 415; 439/64, 246, 247, 248, 266, 296, 345, 352, 372, 374, 378

[56] References Cited

U.S. PATENT DOCUMENTS

| | | | |
|---|---|---|---|
| 3,626,253 | 12/1971 | Sturdivan | 361/338 |
| 3,853,379 | 12/1974 | Goodman | 361/391 |
| 4,131,934 | 12/1978 | Becker | 439/378 |
| 4,236,190 | 11/1980 | Hollingsead | 439/374 |
| 4,414,605 | 11/1983 | Chino | 361/388 |
| 4,598,336 | 7/1986 | Hehl | 361/415 |
| 4,632,588 | 12/1986 | Ftzpatrick | 361/415 |
| 4,694,380 | 9/1987 | Mallory | 361/415 |

Primary Examiner—Gerald P. Tolin
Attorney, Agent, or Firm—Robert W. Lahtinen

[57] ABSTRACT

A structure is shown having three stages for guiding a system component into an operatively mounted position within an enclosure while simultaneously making a blind attachment of the electrical connectors to complete the power and signal circuits between the component and system contained within the enclosure. A coarse positioning structure includes a guide rail means for directing the component toward the operative, mounted position; an intermediate positioning structure functions within the tolerance of the coarse positioning means to substantially align the component including the electrical connectors and a fine positioning means aligns the electrical connectors for the final positioning as the component is latched into the operating position and electrical connections are completed. The three positioning functions are intitated serially.

13 Claims, 7 Drawing Sheets

THREE STAGE SELF ALIGNMENT STRUCTURE AND METHOD

FIELD OF THE INVENTION

The invention relates to equipment enclosures for multi component systems and more particularly to structure for self aligning components during assembly to a system including blind connection of the electrical terminals for power and signal transmission.

Related Application Assigned to the Same Assignee: W. J. Casanova et al, Ser. No. 169,515, filed March 17, 1988 (concurrently with the present application) entitled, "System Cable Assembly and Component Packaging".

BACKGROUND OF THE INVENTION

In an environment requiring customer set up of progressively more complex data handling systems, it is vital that this activity be easily completed, mistake free and without damage to the equipment, particularly frail electrical connectors. An uncomplicated, "user friendly" assembly will enhance user satisfaction. The keying of devices to prevent insertion with the wrong orientation or installation at the wrong location and self alignment of self docking components permits blind plugging of electrical connectors to mechanically and electrically protect the equipment.

In addition to the set up assembly procedure, selective disassembly must be rendered practical as depot servicing of identified component assemblies becomes common. The use of sophisticated diagnostic tools to isolate and identify individual replaceable or repairable system elements is less effective if the user is unable to easily and safely remove the identified system portion. In addition, this activity must be accomplished without equipment damage, particularly the electrical connectors which tend to be the most fragile system elements. This must be accomplished despite the presence of numerous parts which cause tolerance buildup to be severe.

SUMMARY OF THE INVENTION

The structure and technique of the present invention includes three stages of guidance and alignment for use with components that are user installed without the use of tools and make a blind electrical connection. An initial coarse positioning alignment is provided by guideways which may include a confined entry followed by a less confining guide path. As the device or component approaches the installed, operative position, an intermediate alignment means brings the component and its electrical connections to a near alignment from any position within the maximum tolerance of the coarse positioning means. After the intermediate positioning structure brings the component to near alignment approaching the final operating position, a fine positioning structure guides the apparatus and the electrical connectors to a final position whereat the device may be latched and retained in the operating position with the electrical connections completed.

This manner of blind connection by sliding the component into place removes the user responsibility for completing the electrical connection and keeps the connector installation within the control of the designer of the packaging structure. The user does not manually intervene in making the connection, thereby preventing possible mechanical or electrical damage that can occur through manual manipulation of the connectors. This enables use of structural restrictions that restrict components to installation at the correct location and in the proper orientation. By exercising these capabilities, the components and system can be protected from improper installation or electrical connection. Further, user satisfaction can be enhanced as installation is controlled without requiring adherence to instructions that may be or appear to be complex or obscure.

DETAILED DESCRIPTION

Figure 1:
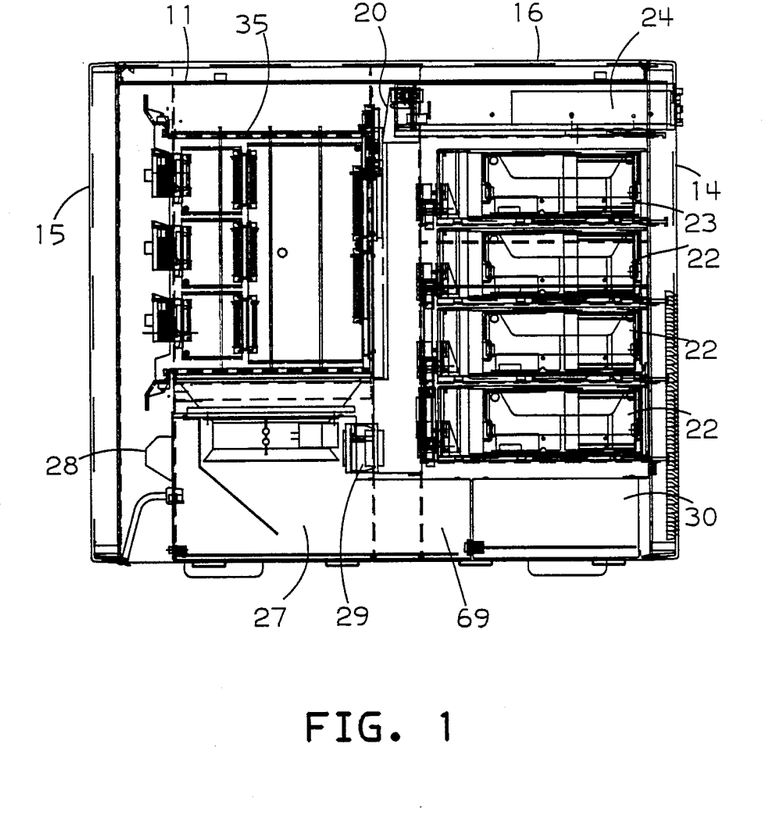
FIG. 1 is a broken away side elevation of a system enclosure illustrating the cable carrier and enclosure chassis and cover structure with self docking components as taught by the present invention.

FIG. 1 illustrates a computer system with side wall and chassis portions broken away to show the mounting of system components. A central cable carrier assembly 20 occupies the space between two stacks or towers of components. The enclosure has front and rear covers 14, 15 that normally enclose the chassis ends through which the components are mounted. Component installation is effected by inserting the component in a guideway and moving it to an operative, latched position at which blind electrical connections have been completed between component mounted connectors and cooperating connectors disposed on the cable carrier. By simply inserting the component it becomes latched into position with both power and signal bus electrical connections completed.

As shown, five magnetic storage devices are mountable behind the front cover. Rigid disk drives or direct access storage devices (DASD) are mounted in the positions designated 22 and a diskette drive 24 is mounted in the uppermost position. The device 23 may be either a fourth DASD or a tape drive. The diskette drive 24 extends through an opening in the cover 14 and when a tape drive is used, a cover opening is provided so that both devices will have access for insertion and removal of magnetic media without cover removal.

Under the rear cover a logic cage 35 is secured to the enclosure chassis 11 and connected to the cable carrier assembly 20. A series of logic books 53 containing circuit cards are inserted into the logic cage 35 to become electrically connected in the fully inserted, latched position. Each logic book 53 may take the form of a book that fully occupies the book frame or may include a base card portion to which daughter books can be attached as shown in FIG. 1. Also visible in FIG. 1 is the AC power supply 27 which achieves a blind connection with the cable carrier assembly when fully inserted. The AC power supply 27 is connected to the AC input to the system and has as its output the DC power levels required by the system. The DC feature power supply 30 mounts under the front cover 14 and docks with the AC power supply 27 to complete electrical connection to the system.

The magnetic media design requires that disk files (DASD), tapes and diskettes be customer featurable and installable without the customer hand plugging cable connections to, the system. This requires a design whereby the mating signal bus and power connectors self align and connect upon installation of the storage device. Another advantage of using such a design constraint is the flexibility of having a common interface for storage devices which enables storage devices from various vendors to be installed in this auto-aligning base assembly.

Figure 2:
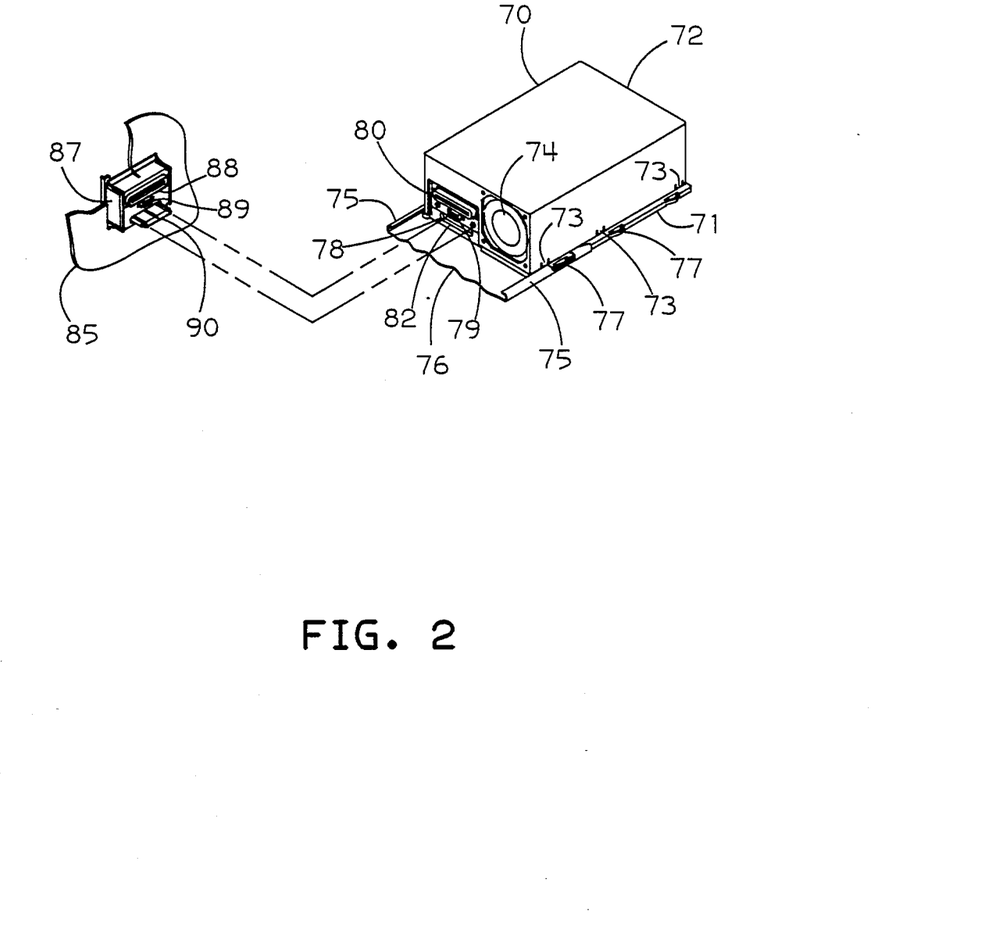
FIG. 2 shows the magnetic media cage structure and cooperating frame and connector block structures.

The magnetic storage components shown in FIG. 1 are carried in cages 70 as shown in FIG. 2. Each magnetic media cage 70 enclosure includes a carrier base 71 and a cover 72. At each side of cover 72 three depending, resilient latch elements 73 are formed as integral portions of the molded cover 72 with latching projections (not shown) at the distal ends. The latching projections are received in slots in carrier base 71 and are received behind a shoulder in the carrier to retain the cover. The cover also has a rear opening 74 at which a circulating fan is mounted and a series of slotted openings in the front wall (not shown) to provide an air passage through the length of the cage.

The carrier base 71 extends beyond the cover 72 at each lateral side to form rails that are received in turned U-shaped guideways 75 formed in the enclosure frame member 76. Frame member 76 is an integral part of the chassis 11. Three spring fingers 77, molded as a part of the carrier base 71, function to eliminate slack or play between carrier base and frame by biasing the component-cage assembly toward the opposite guide channel 75. The carrier base 71 also includes an upright projection 78 on which the power connector 79 and signal connector 80 are mounted and retained by a metal plate 81 bolted to the projection. Power connector 79 is fixed relative to the projection, but the signal connector 80 is allowed to float to accommodate misalignment. Beneath the connectors is a slotted opening 82 with a wide chamferred surface 83 surrounding the opening.

The wall 85 of cable carrier 20 (FIG. 3) supports a cooperating connector block assembly 87 that presents a floating signal connector 88, a floating power connector 89 and a fixed tapered alignment tongue 90. The alignment tongue 90 is formed as a part of block 91. Signal connector 88 and power connector 89 have oversize openings at each side that receive molded cylindrical projections 93 formed in block 91 to permit relative movement between the connectors 88, 89 and block 91 to the extent of the clearance between the projections and the oversize openings.

The data storage devices mount on the carrier base 71 which is inserted into the guide rails 75 on the enclosure frame 76. The guide rails 75 limit vertical and horizontal travel of the base carrier 71. As the device is inserted further into the rails 75, molded-in spring fingers 77 on one side force the device against the registration edge surface of the opposite rail 75 for the initial or coarse alignment of the device.

Figure 3:
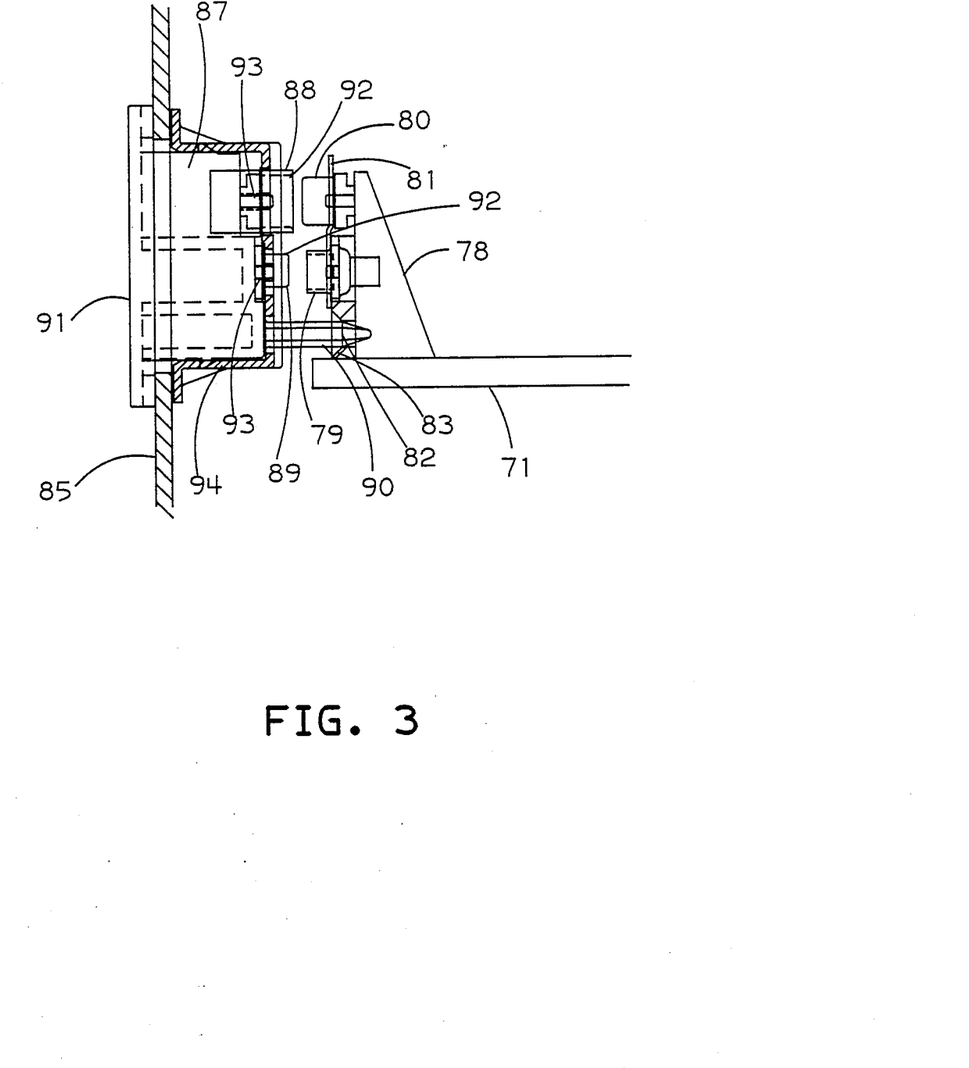
FIG. 3 illustrates details of the connector portions of the structure of FIG. 2.

Inserting the carrier base 71 further along the guide rails 75 positions the locator slot 82, positioned below the signal bus and power connectors on the rear of the carrier base 71, into alignment with tongue 90 (formed as a part of the mating connector block 91). Connector block 91 mounts through an opening in the cable carrier wall 85 which is larger in size than the carrier block thus allowing it horizontal and vertical motion. After the base locator slot and the connector block tongue are engaged (for approximately 12 millimeters) the intermediate alignment has been completed and the mating connectors of the base 71 and connector block 91 will be properly aligned for the final insertion to the operating position.

The intermediate alignment has brought the cooperating electrical connectors to sufficiently close alignment to permit the connections to be completed by the fine positioning or alignment effected by the chamfered surfaces 92 of the cooperating connectors. The signal bus connector 80 on carrier plate 71 is allowed to float on mounting pins of smaller diameter than the mounting holes, while the power connector 79 is rigidly held in position by its mounting pins. The connectors on the floating connector block 91 mount over pins of smaller diameter and are retained by snap on clamp 94 which allows some amount of connector movement on their pins. When the connector come together this allowable movement takes up differences in the tolerances of the hardware as the cage 70 moves to the docked position.

In the system illustrated in FIG. 1, a logic cage 35 is mounted on the chassis 11 and electrically connected to the cable carrier 20. Cage 35 is connected to chassis 11 by bolts that extend through holes 36 (FIG. 4) and cooperating openings in the chassis. The logic cage 35 is formed of an upper casting 40 and a lower casting 41, a pair of side panels 13 and a rear wall or backplane 45. The upper and lower castings include a series of recessed grooves or guideways 42 that are restricted adjacent the entry by opposed projections 31 and a series of projecting latching structures 43. A latching bar 63 extends along the forward flange of both the upper and lower castings 40, 41. Additionally, because a cooling fan (FIG. 1) is located immediately below the logic cage, the openings in the central part of casting 41 that overlay the rotating impeller have an additional cross member 32 restricting the opening for purposes of safety. The rear wall 45 has connector portions 49 which connect to the system cabling of cable carrier assembly 20 and a series of connectors 48 aligned with the logic book mounting positions within the cage 35.

Figure 4:
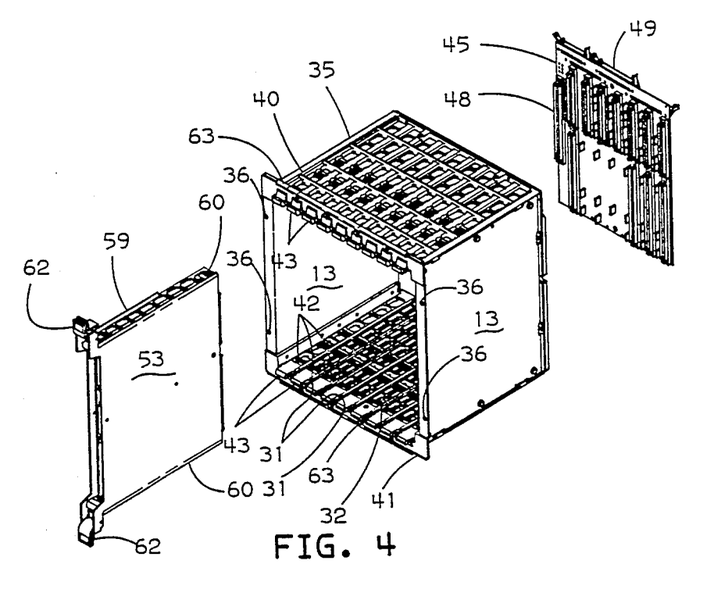
FIG. 4 is an exploded view of the logic cage and logic card book of the system of FIG. 1.
Figure 5:
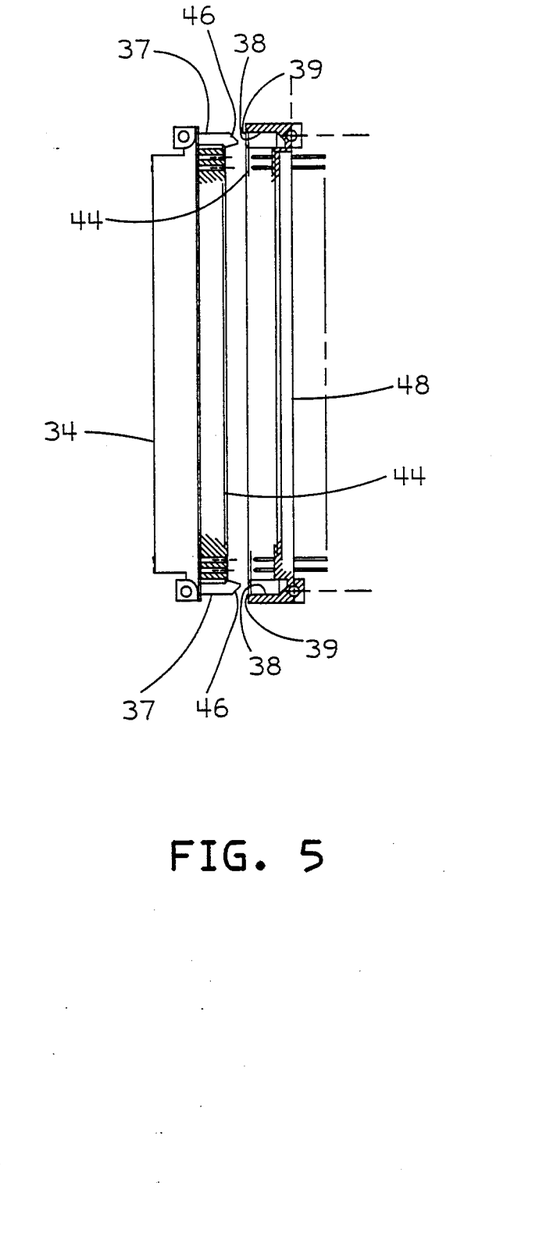
FIGS. 5 and 6 show section views of the cooperating logic book and logic cage electrical connectors.
Figure 6:
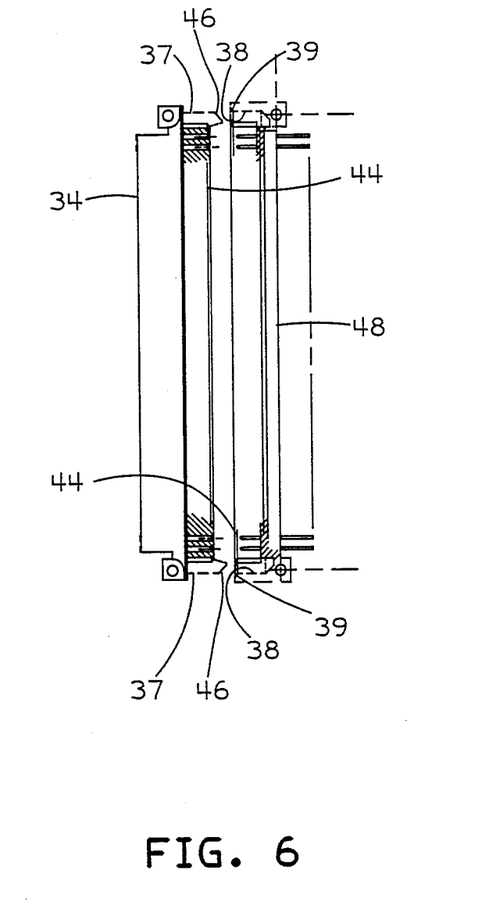

The logic books 53 each have upper and lower pairs of rails. Three rails 60 extend the full length of the book. The fourth rail 59 is foreshortened (as shown) to cooperate with a restriction in the guideway 42 in the upper casting 40 to prevent insertion of the book in an inverted orientation. Each logic book 53 carries one or a plurality of connector portions 34 which connect to a corresponding, cooperating connector portion 48 mounted on the cage rear wall 45 and aligned with the book operatively mounted position. As seen in FIGS. 5 and 6 the connector portion 34 carries tapered pins 37 at each end that are received in corresponding openings 38 in the back wall mounted connector portion 48. The openings each have a chamfered surface 39 at the entry thereto. The pin taper 46 and the chamfered opening surface 39 in combination provide an alignment capability greater than the total of the guideway tolerance plus the cumulative part tolerance to provide an intermediate positioning and alignment before the balance of the connector portions engage.

A third stage of fine positioning or alignment is provided by the chamfered edges 44 of the connector portions 34, 48 which can engage only after the intermediate alignment is complete.

Figure 7:
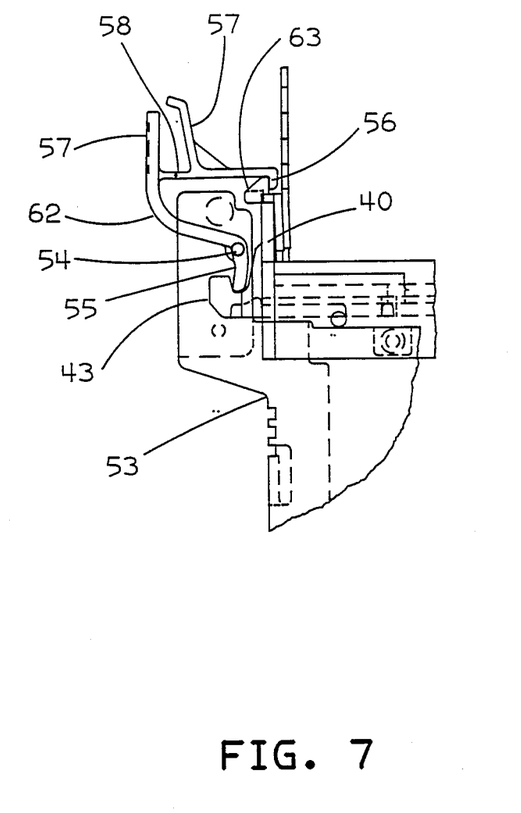
FIG. 7 is a detail view of the latch structure that retains the logic book in the logic cage.

As seen in FIG. 7, the latch 62 mounted on logic book 53 is formed of resilient material and rotates about pin 54. When the book is approaching full insertion the latch 62 can be rotated to have the projection 55 engage the depression in projection 43 followed by the latch portion 56 riding over the bar 63 to an engaged retaining position behind bar 63 as illustrated. When it is desired to release the latch 62, the surfaces 57 are pressed toward one another to bend the web 58 and pivot the projection 56 out of a position of engagement with bar 63.

During the installation of logic books, coarse alignment is provided by the interface of rails 59, 60 to grooves 42 in cage 35. At the entry the projections 31 cause the book rails 59, 60 to be more closely confined than in the wider guideway 42 beyond this insertion location.

At the connector or back plane end of the logic cage the guideways 42 are sized to account for all system tolerances; such as cage, back plane, book and connector location. At the book entry end of the cage 35 there is no need to account for connector and back plane tolerances. The only considerations are the uniform positioning of books 53 for appearance and air flow and assurance that no interference occurs with respect to the latching function. These are minor constraints compared to the alignment requirements at the back plane. The critical requirement is the amount of restraint that provides optimum function at the back plane. For this purpose the guideways 42 taper to a greater width at the back plane or rear wall 45. The amount of taper is dictated by the degree of freedom required to accommodate the system tolerances at the back plane, which are enumerated above, while limiting the degree of freedom to a tolerance that is within the range of control of the intermediate alignment or positioning means.

Intermediate alignment is performed with structure added to the connector portions. FIG. 5 shows connector portions 34, 48 in a position to begin engaging after coarse alignment is completed. Connector portion 34 is shown aligned, but is likely to be misaligned by being positioned in a downward pivoted attitude as the book 53 is tipped down due to the taper in the cage floor. The two rectangular posts 37 with pyramidal shaped ends 46 are added to the ends of connector portion 34 and mating recesses 38 are added to the ends of connector portion 48. Tapered end 46 will cause connector half to ride up and self center vertically when it contacts the bevel 39 on the connector recess 38.

Fine alignment occurs when bevel 44 on the face of connector portion 34 contacts mating bevel on the face of connector portion 48. These beveled surfaces are common features on connectors and act to cam the connector halves both horizontally and vertically into a position where the connector bodies can fully engage.

The result of the three stage alignment systems described above is the ability to accommodate relatively large amounts of tolerance buildup, completely eliminate the possibility of damage to the connectors, and to provide automatic self centering of a connector system in an operator friendly mode where the application is blind. The system described is applicable to many devices that must be plugged by untrained operators into a device where guidance must be provided.

This description of the present invention has been given as an example and it will be understood that various changes in form and details may be made therein without departing from the spirit and scope of the invention.

What is claimed is:

1. A three stages self-docking structure receiving and electrically connecting a component, wherein said component carries an electrical connector, said component mounted within a system enclosure wherein the component is supported for operation and including a mating electrical connector in said enclosure comprising:

coarse positioning means including a pair of guide rails supported by one of said system enclosure and said component and cooperating guideway means, in which said guide rails are slidably received, carried by the other of said system enclosure and said component;

biasing means for urging said component in a direction to maintain engagement between one guide rail and its cooperating guideway means;

intermediate positioning means including a projection on one of said component and said enclosure and a cooperating receiving opening carried by the other of said component and said enclosure with at least one of said projection and said opening including a tapered portion wherein the total taper substantially aligns said electrical connector and the cooperating mating electrical connector from within the tolerance of said coarse positioning means; and fine positioning means formed as a plurality of tapered surfaces on at least one of said electrical connector and said cooperating mating electrical connector to guide said electrical connectors to an electrically connected condition as said component is guided to the operating position within said enclosure.

2. The three stage self-docking structure of claim 1 wherein
said intermediate positioning means includes tapered aligning surfaces on both said projection and said receiving opening and
said fine positioning means includes tapered aligning surfaces on both cooperating electrical connectors operable to align said connectors from within the maximum tolerance allowed by said intermediate positioning means.

3. The three stage self-docking structure of claim 2 wherein said coarse positioning means includes a guide rail carried at each side of said component and cooperating guideways supported by said enclosure.

4. The three stage self-docking structure of claim 3 wherein said biasing means is formed as an integral part of the guide rail other than said one guide rail.

5. The three stage self-docking structure of claim 4 wherein said component is affixed to a base carried which has the pair of guide rails and said biasing means formed as an integral part thereof.

6. The three stage self-docking structure of claim 5 further comprising releasable latch means engagable with the structure of said enclosure for retaining said component in said operating position.

7. The three stage self-docking structure of claim 6 wherein said base carrier is formed of molded plastic and said pair of rails, said biasing means and said releasable latch means are integral portions of a single molded part.

8. A three stage self docking structure receiving and electrically connecting a component, wherein said component carries an electrical connector, said connector mounted within a system enclosure and wherein the component is supported for operation and including a mating electrical connector in said enclosure comprising:

coarse positioning means for confining and guiding said component toward the operatively installed electrically connected position;

intermediate positioning means for substantially aligning said component including said electrical connector with the final operating position within the tolerance permitted by said coarse positioning means; and fine positioning means comprising a plurality of tapered surfaces on at least one of said electrical connector and the cooperating mating electrical connector enabling a blind, completed electrical connection of said component to said system in the operating position; and wherein said coarse positioning means comprises two pairs of rails with said pairs of rails disposed at opposite sides of said component and recessed guideway carried by the enclosure in which said component is supported; and further wherein one of said side rails and one of said recessed guideways are shorter than the other of said rails and said recessed guideways thereby preventing the insertion of said component in an inverted position.

9. The three stage self-docking structure of claim 8 wherein said guideways have a narrow width portion adjoining the location at which the component rails enter whereby said component is more closely confined at the entry and afforded greater tolerance in the remainder of the guideway.

10. The three stage self-docking structure of claim 9 wherein said guideway has diverging confining wall portions subsequent to said narrower width portion.

11. The three stage self-docking structure of claim 10 further comprising dual releasable latch means for retaining said component in said operating position.

12. A three stage self docking structure receiving and electrically connecting a component, wherein said component carries an electrical connector, said connector mounted within a system enclosure and wherein the component is supported for operation and including a mating electrical connector in said enclosure comprising:

a component supporting frame;

closely confined entry and loosely confined guide means for guiding said component along a guide surface toward the operatively connected installed position;

tapered pin means carried by one of said component and said frame;

a pin receiving opening carried by the other of said component and said frame positioned to receive and substantially align said pin within the tolerance of said guide means; and tapered, cooperating connector surface portions respectively carried by said component electrical connector and said system enclosure mating electrical connector which are engagable after said tapered pin is received in said opening in complete the electrical connection; wherein said guide means comprises pairs of rails mounted on opposite sides of said component and recessed guideways supported on said system enclosure and adapted to receive said rails; further wherein one of said rails and one of said guideways is shorter than the other of said rails and said guideways and said shorter rail and said shorter guideway cooperate to prevent insertion of said component into said enclosure in an inverted orientation.

13. The three stage self-docking structure of claim 12 further comprising dual latch means for retaining said component in a fully inserted position following said completion of the electrical connection.

* * * * *